(12) United States Patent
Du et al.

(10) Patent No.: US 12,178,060 B2
(45) Date of Patent: Dec. 24, 2024

(54) ELECTROLUMINESCENT DEVICE, METHOD FOR MANUFACTURING THE SAME, DISPLAY PANEL AND DISPLAY DEVICE

(71) Applicant: BOE Technology Group Co., Ltd., Beijing (CN)

(72) Inventors: Xiaobo Du, Beijing (CN); Haidong Wu, Beijing (CN); Yansong Li, Beijing (CN); Bei Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 450 days.

(21) Appl. No.: 17/536,801

(22) Filed: Nov. 29, 2021

(65) Prior Publication Data

US 2022/0238828 A1    Jul. 28, 2022

(30) Foreign Application Priority Data

Jan. 22, 2021  (CN) .......................... 202110090327.2

(51) Int. Cl.
| | | |
|---|---|---|
| *H10K 50/11* | (2023.01) | |
| *H10K 50/17* | (2023.01) | |
| *H10K 71/00* | (2023.01) | |
| *H10K 101/30* | (2023.01) | |
| *H10K 101/40* | (2023.01) | |
| *H10K 102/00* | (2023.01) | |

(52) U.S. Cl.
CPC .............. *H10K 50/11* (2023.02); *H10K 50/17* (2023.02); *H10K 71/00* (2023.02); *H10K 2101/30* (2023.02); *H10K 2101/40* (2023.02); *H10K 2102/351* (2023.02)

(58) Field of Classification Search
CPC ........ H10K 50/11; H10K 50/17; H10K 71/00; H10K 2101/30; H10K 2101/40; H10K 2102/351; H10K 59/10
See application file for complete search history.

(56) References Cited

U.S. PATENT DOCUMENTS

2014/0110682 A1* 4/2014 Shih ..................... H10K 50/852
257/40
2019/0326546 A1* 10/2019 Li .......................... H10K 71/00

* cited by examiner

*Primary Examiner* — Mohammad A Rahman
(74) *Attorney, Agent, or Firm* — IPro, PLLC

(57) ABSTRACT

An electroluminescent device, a method for manufacturing the electroluminescent device, a display panel and a display device are provided in the embodiments of the present application. The electroluminescent device includes an anode layer, a first hole injection layer and a hole transport layer. The first hole injection layer is located between the anode layer and the hole transport layer; the first hole injection layer includes at least two secondary hole injection layers, and an equivalent resistance value of the at least two secondary hole injection layers is greater than a first threshold value.

20 Claims, 2 Drawing Sheets

ELECTROLUMINESCENT DEVICE, METHOD FOR MANUFACTURING THE SAME, DISPLAY PANEL AND DISPLAY DEVICE

CROSS-REFERENCE TO RELATED APPLICATION

This application claims a priority to Chinese Patent Application No. 202110090327.2 filed in China on Jan. 22, 2021, the entire contents of which are hereby incorporated by reference.

TECHNICAL FIELD

The present disclosure relates to the field of display technology, in particular to an electroluminescent device, a method for manufacturing the electroluminescent device, a display panel and a display device.

BACKGROUND

Along with the development of display technology, an OLED (Organic Light-Emitting Diode) display panel has been more and more popular due to such advantages as high brightness, color saturation, light and thin, and bendable.

SUMMARY

In an aspect, an electroluminescent device is provided in the embodiments of the present application, including an anode layer, a first hole injection layer and a hole transport layer. The first hole injection layer is located between the anode layer and the hole transport layer, the first hole injection layer includes at least two secondary hole injection layers, and an equivalent resistance value of the at least two secondary hole injection layers is greater than a first threshold value, where the first threshold value is a resistance value of a second hole injection layer in a case that one second hole injection layer is arranged between the anode layer and the hole transport layer. A thickness of the second hole injection layer is equal to a thickness of the first hole injection layer, and resistivity of each secondary hole injection layer is not less than resistivity of the second hole injection layer.

In another aspect, a method for manufacturing an electroluminescent device is further provided in the embodiments of the present application, including forming a first hole injection layer including at least two secondary hole injection layers on one side of the anode layer, and forming a hole transport layer on one side of the first hole injection layer away from the anode layer. An equivalent resistance value of the at least two secondary hole injection layers is greater than a first threshold value, where the first threshold value is a resistance value of a second hole injection layer in a case that one second hole injection layer is arranged between the anode layer and the hole transport layer. A thickness of the second hole injection layer is equal to a thickness of the first hole injection layer, and resistivity of each secondary hole injection layer is not less than resistivity of the second hole injection layer.

In yet another aspect, a display panel is further provided in the embodiments of the present application, including the above-mentioned electroluminescent device.

In still yet another aspect, a display device is further provided in the embodiments of the present application, including the above-mentioned electroluminescent device or the above-mentioned display panel.

The other aspects and the advantages of the present disclosure will be given as follows, or will become more apparent, or will be understood through practices.

BRIEF DESCRIPTION OF THE DRAWINGS

The above and/or the other aspects and advantages of the present disclosure will become more apparent and understandable in conjunction with the drawings and the embodiments, and in these drawings.

DETAILED DESCRIPTION

Figure 1:
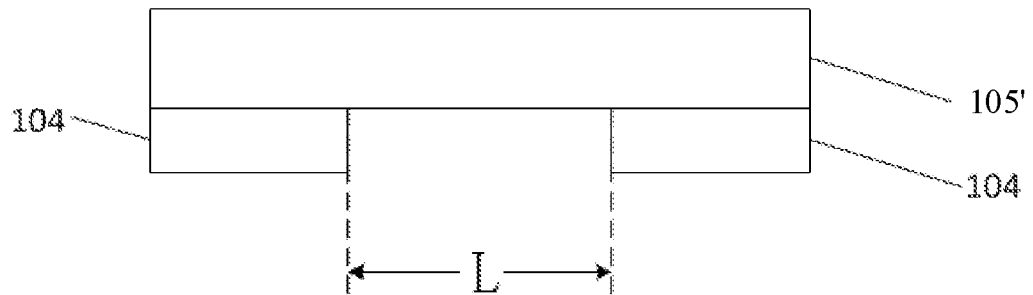
FIG. 1 is a schematic view showing a structure of two adjacent pixels in an electroluminescent device in the related art.

The present disclosure will be described hereinafter in conjunction with the embodiments and the drawings. Identical or similar reference numbers in the drawings represent an identical or similar element or elements having an identical or similar function. In addition, the detailed description about any known technology, which is unnecessary to the features in the embodiments of the present disclosure, will be omitted. The following embodiments are for illustrative purposes only, but shall not be used to limit the scope of the present disclosure.

Unless otherwise defined, any technical or scientific term used herein shall have the common meaning understood by a person of ordinary skills. Any term defined in a commonly-used dictionary shall be understood as having the meaning in conformity with that in the related art, shall not be interpreted idealistically and extremely.

It should be appreciated that, unless otherwise defined, such words as "one" or "one of" are merely used to represent the existence of at least one member, rather than to limit the number thereof. Such words as "include" or "including" intend to indicate that there are the features, integers, steps, operations, elements and/or assemblies, without excluding the existence or addition of one or more other features, integers, steps, operations, elements, assemblies and/or combinations thereof.

Several terms related in the present disclosure are described and explained firstly.

Highest occupied molecular orbital (HOMO), i.e., an orbital of a highest energy level occupied by an electron.

Lowest unoccupied molecular orbital (LUMO), i.e., an orbital of a lowest energy level not occupied by an electron.

Energy level. Electrons are only capable of moving on specific, discrete orbitals outside a nucleus, the electrons on the orbitals have discrete energy values, and the energy values are energy levels.

An electroluminescent device of an OLED display panel includes an anode layer and a hole transport layer. Generally, it is necessary to provide a hole injection layer between the anode layer and the hole transport layer due to a large energy level difference between energy levels of the anode layer and the hole transport layer, so as to reduce a potential barrier for injecting holes from the anode layer, thereby to ensure the injection of carriers.

However, in the conventional electroluminescent device, an issue of lateral transport of the carriers in the hole injection layer is severe, and thereby crosstalk occurs in the electroluminescent device.

An objective of the present disclosure is to provide an electroluminescent device, a method for manufacturing the electroluminescent device, a display panel and a display device, so as to address the issue that crosstalk of carriers occurs easily in the conventional electroluminescent device.

FIG. 1 is a schematic view showing a structure of two adjacent pixels in the conventional electroluminescent device. A resistance value R between the anode layers 104 in the two adjacent pixels and the second hole injection layer 105' is calculated through a formula (1) and a formula (2).

$$R=2R1+R2 \qquad \text{formula (1)}$$

$$R2=\rho \times L/S \qquad \text{formula (2)}$$

In the formula 1, R1 represents an interfacial resistance value between the anode layer 104 and the second hole injection layer 105', and R2 represents a resistance value of the second hole injection layer 105'. In the formula 2, ρ represents resistivity of the second hole injection layer 105', L represents a distance between two anode layers 104 connected to the same second hole injection layer 105' in two adjacent pixels, and S represents a cross-sectional area of the second hole injection layer 105'.

According to the formula 2, when a thickness of the second hole injection layer 105' and a position thereof related to the anode layer 104 are maintained, i.e., values of the distance L and the cross-sectional area S are maintained, it is able to reduce the resistance value R2 of the second hole injection layer 105' through reducing the resistivity ρ of the second hole injection layer 105'. In addition, the interfacial resistance R1 decreases along with a decrease in the resistivity ρ of the second hole injection layer 105'. According to the formula 1, the resistance value R between the anode layers 104 in two adjacent pixels and the second hole injection layer 105' also decreases along with the decrease in the resistivity ρ of the second hole injection layer 105'.

It has been found that, in the case that the resistivity ρ of the second hole injection layer 105' is reduced, the interfacial resistance R1 is reduced, and accordingly, a potential barrier between the anode layer 104 and the second hole injection layer 105' is reduced, thereby facilitating the injection of carriers. However, when the resistivity ρ of the second hole injection layer 105' is decreased, the resistance value R2 of the second hole injection layer 105' is also decreased, so lateral transport of carriers at an interface between the anode layers 104 and the second hole injection layer 105', i.e., carriers are transferred from one anode layer 104 to the other anode layer 104 through the second hole injection layer 105', occurs easily thereby crosstalk occurs in the electroluminescent device. Along with the resistance value R2 of the second hole injection layer 105' decreases, a probability that crosstalk occurs in the electroluminescent device increases, which seriously affects the normal operation of the electroluminescent device.

The technical solutions of the present disclosure and how the above-mentioned technical issues are addressed thereby are described in detail in the following specific embodiments.

Figure 2:
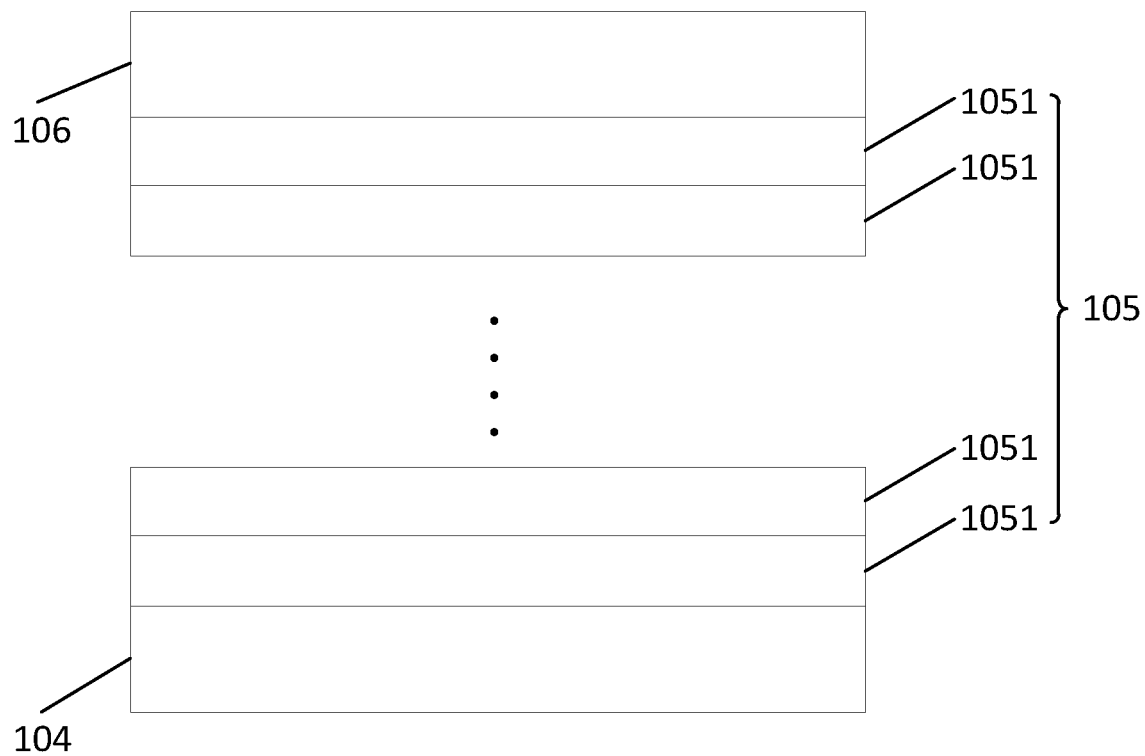
FIG. 2 is a schematic structural view showing an electroluminescent device according to an embodiment of the present disclosure.

An electroluminescent device is provided in the embodiments of the present disclosure. As shown in FIG. 2, the electroluminescent device includes an anode layer 104, a first hole injection layer 105 and a hole transport layer 106. The first hole injection layer 105 is located between the anode layer 104 and the hole transport layer 106. The first hole injection layer 105 includes at least two secondary hole injection layers 1051, an equivalent resistance value of the at least two secondary hole injection layers 1051 is greater than a first threshold value, where the first threshold value is a resistance value of a second hole injection layer in a case that one second hole injection layer is arranged between the anode layer 104 and the hole transport layer 106. A thickness of the second hole injection layer is equal to a thickness of the first hole injection layer 105, and resistivity of each secondary hole injection layer 1051 is not less than resistivity of the second hole injection layer.

In the electroluminescent device in the embodiments of the present disclosure, when there are multiple secondary hole injection layers 1051, there are multiple secondary hole injection layers 1051 with different resistance values in the first hole injection layer 105, an overall resistance value (or equivalent resistance value) of the first hole injection layer 105 is less than a resistance value of any one of the secondary hole injection layers 1051, and the overall resistance value of the first hole injection layer 105 of the present disclosure is greater than a resistance value of a hole injection layer (namely, the second hole injection layer) provided in a single layer. Thus, it is able to increase a resistance value of a lateral transport path of a hole injection layer between an anode layer and a hole transport layer as a whole, suppress the lateral transport of the carriers along the hole injection layer, and reduce the probability of crosstalk occurring in the electroluminescent device, thereby to ensure the operational stability of the electroluminescent device. The carriers include holes.

In some embodiments, resistivity of a secondary hole injection layer 1051 adjacent to the anode layer 104 may be set to be equal to the resistivity of the second hole injection layer, and resistivity of each of other secondary hole injection layers 1051 is greater than the resistivity of the second hole injection layer, so as to further increase the resistance value of the lateral transport path of the hole injection layer.

In some embodiments, a resistance value of the secondary hole injection layer 1051 adjacent to the anode layer 104 is less than a resistance value of a secondary hole injection layer 1051 adjacent to the hole transport layer 106.

Figure 3:
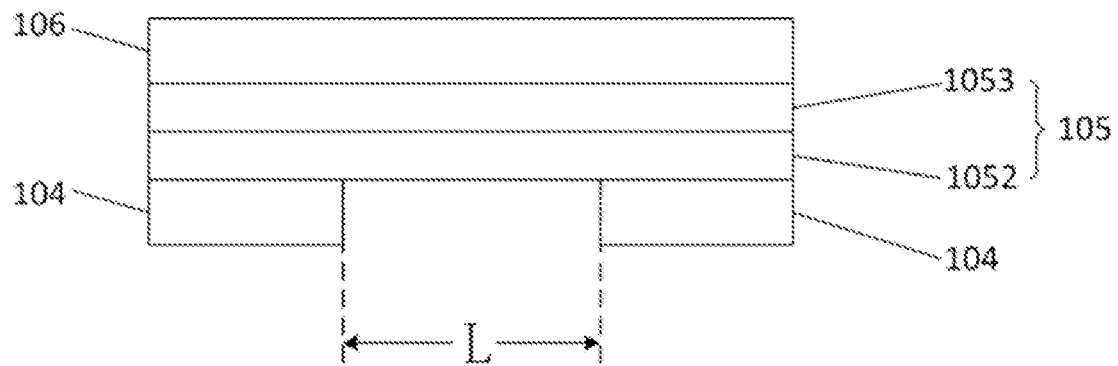
FIG. 3 is a schematic view showing a structure of two adjacent pixels in the electroluminescent device according to an embodiment of the present disclosure.

A theory of the electroluminescent device in the embodiment of the present disclosure is described with reference to FIG. 3, which is a schematic view of a structure of two adjacent pixels in the electroluminescent device. For ease of description, in the embodiments of the present disclosure, the first hole injection layer 105 includes two secondary hole injection layers. Optionally, as shown in FIG. 3, the first hole injection layer 105 includes a first secondary hole injection layer 1052 and a second secondary hole injection layer 1053, and a resistance value R3 between the anode layers 104 in the two adjacent pixels and the first hole injection layer 105 is calculated through a formula (3).

$$R3=2R4+R5\times R6/(R5+R6) \qquad \text{formula (3)}$$

In the formula (3), R4 represents an interfacial resistance value between the anode layer 104 and the first secondary hole injection layer 1052, R5 represents a resistance value of the first secondary hole injection layer 1052, and R6 represents a resistance value of the second secondary hole injection layer 1053.

According to the formula 2, the resistance value R5 of the first secondary hole injection layer 1052 and the resistance value R6 of the second secondary hole injection layer 1053 are related to the respective resistivity, the respective cross-sectional areas S and the respective distances L between the two anode layers 104 connected to the first hole injection layer 105. In the case that the cross-sectional area and the distance L between the two anode layers 104 connected to the first hole injection layer 105 are maintained, it is able to determine the resistance value R5 and the resistance value R6 by controlling the resistivity $\rho_1$ of the first secondary hole injection layer 1052 and the resistivity $\rho_2$ of the second secondary hole injection layer 1053.

In the embodiments of the present disclosure, the distance L in FIG. 3 is the same as the distance L in FIG. 1, and the hole injection layer of the single layer structure in FIG. 1 is divided into the first secondary hole injection layer 1052 and the second secondary hole injection layer 1053 with a same shape and volume size in FIG. 3. As a result, the cross-sectional area of the first secondary hole injection layer 1052 is S/2, and the cross-sectional area of the second secondary hole injection layer 1053 is S/2 (because a thickness of the first secondary hole injection layer 1052 and a thickness of the second secondary hole injection layer 1053 are both half the thickness of the second hole injection layer). It may be obtained from formula 2 that the resistance value R5 is $2\rho_1*1/S$, and the resistance value R6 is $2\rho_2*1/S$. In the case that the resistivity $\rho_1$ is less than the resistivity $\rho_2$, the resistance value R6 is greater than the resistance value R5. For ease of description, in the embodiments of the present disclosure, the resistivity $\rho_1$ is the same as the resistivity $\rho$ of the second hole injection layer 105' in FIG. 1, and thereby the resistance value R5=2R2. Hence, a resistance value R7 of the first hole injection layer 105 is calculated in the following formula.

$$R7=R5*R6/(R5+R6)=2R2/(1+2R2/R6)>2R2/(1+2R2/2R2)=R2$$

In other words, the resistance value R7 of the first hole injection layer 105 including the first secondary hole injection layer 1052 and the second secondary hole injection layer 1053 is greater than the resistance value R2 of the second hole injection layer 105' in FIG. 1, and the resistance value of the lateral transport path in the first hole injection layer 105 in FIG. 3 is greater than the resistance value of the lateral transport path in the second hole injection layer 105' in FIG. 1, thereby to suppress the lateral transport of holes in the hole injection layer. Similarly, the resistance value R3 between the anode layers 104 in the two adjacent pixels and the first hole injection layer 105 is also greater than the resistance value R, so as to further suppress the lateral transport of carriers in the hole injection layer.

According to the above-mentioned analysis, when the resistance value of the secondary hole injection layer 1051 in direct contact with the anode layer 104 decreases, the potential barrier between the anode layer 104 and the secondary hole injection layer 1051 decreases, so as to facilitate the injection of hole carriers from the anode layer 104 into the secondary hole injection layer 1051. In the embodiments of the present disclosure, the resistance value of the secondary hole injection layer 1051 adjacent to the anode layer 104 is less than the resistance value of the secondary hole injection layer 1051 adjacent to the hole transport layer 106. In other words, in the case that the resistance value of the secondary hole injection layer 1051 among the secondary hole injection layers 1051 closest to the anode layer 104 is the smallest, it is able to ensure the injection efficiency of carriers into the secondary hole injection layer 1051 from the anode layer 104.

As can be appreciated by those skilled in the art, through controlling the resistivity of each secondary hole injection layer 1051, it is able to adjust the resistance values of the secondary hole injection layers 1051, thereby adjust HOMO levels of the secondary hole injection layers 1051 and the overall resistance value of the first hole injection layer 105. Furthermore, it is able to ensure the effective injection of hole carriers through controlling the resistivity of the secondary hole injection layer 1051 closest to the anode layer 104.

In an embodiment of the present disclosure, resistance values of secondary hole injection layers 1051 increase in a step-like manner in a direction from the anode layer 104 to the hole transport layer 106.

In a possible embodiment of the present disclosure, at least two adjacent secondary hole injection layers 1051 may have a same resistance value in the first hole injection layer 105, and it is only necessary to ensure that the resistance values of the secondary hole injection layers 1051 shows a step-like increasing trend in the direction from the anode layer 104 to the hole transport layer 106, so as to ensure that the overall resistance value of the first hole injection layer 105 is greater than the resistance value of any one of the secondary hole injection layers 1051, and to increase the resistance value of the lateral transport path in the hole injection layer. Therefore, it is able to suppress the lateral transport of carriers along the hole injection layer, reduce the probability of crosstalk occurring in the electroluminescent device, thereby to ensure the operational stability of the electroluminescent device.

Furthermore, when the resistance values of the secondary hole injection layers 1051 increase in the step-like manner, the resistance value of the secondary hole injection layer 1051 adjacent to the anode layer 104 is less than the resistance value of the secondary hole injection layer 1051 relatively far away from the anode layer 104. Thus, it is able to ensure the injection efficiency of carriers from the anode layer 104 to the secondary hole injection layer 1051 adjacent to the anode layer 104. The carriers may pass through the secondary hole injection layers 1051 successively and be transported to the hole transport layer 106, thereby ensuring the effective injection and transport of carriers in the electroluminescent device.

In an embodiment of the present disclosure, the resistance values of the at least two secondary hole injection layers 1051 increase gradually in the direction from the anode layer 104 to the hole transport layer 106. As can be appreciated by those skilled in the art, among the multiple secondary hole injection layers 1051, there may be at least two adjacent secondary hole injection layers 1051 having the same resistance value, and it is only necessary to ensure that the resistance values of the at least two secondary hole injection layers 1051 increase gradually in the direction from the anode layer 104 to the hole transport layer 106.

In a possible embodiment of the present disclosure, in the direction from the anode layer 104 to the hole transport layer 106, the resistance values of all the secondary hole injection layers 1051 in the first hole injection layer 105 increase gradually, so it is able to ensure that the overall resistance value of the hole injection layer increases, thereby to ensure that the resistance value of the lateral transport path in the hole injection layer increases. As a result, it is able to suppress the lateral transport of carriers along the hole injection layer, reduce the probability of crosstalk occurring in the electroluminescent device, thereby to ensure the operational stability of the electroluminescent device. Furthermore, in the direction from the anode layer 104 toward the hole transport layer 106, it is able to ensure the uniformity of variation in the resistance value of the hole injection layers, thereby to ensure the transport stability of the carriers in this direction.

In an embodiment of the present disclosure, the resistivity of the secondary hole injection layer adjacent to anode layer 104 is less than the resistivity of the secondary hole injection layer adjacent to hole transport layer 106.

In a possible embodiment of the present disclosure, the resistivity of the first secondary hole injection layer 1052 is less than the resistivity of the second secondary hole injection layer 1053, so that the resistance value R5 of the first secondary hole injection layer 1052 is less than the resistance value R6 of the second secondary hole injection layer 1053, thereby ensuring the injection efficiency of the carriers.

In an embodiment of the present disclosure, a material of which each secondary hole injection layer 1051 is made includes a first hole injection material, and contents of the first hole injection material in the secondary hole injection layers 1051 decrease in the direction from the anode layer 104 to the hole transport layer 106.

Figure 4:
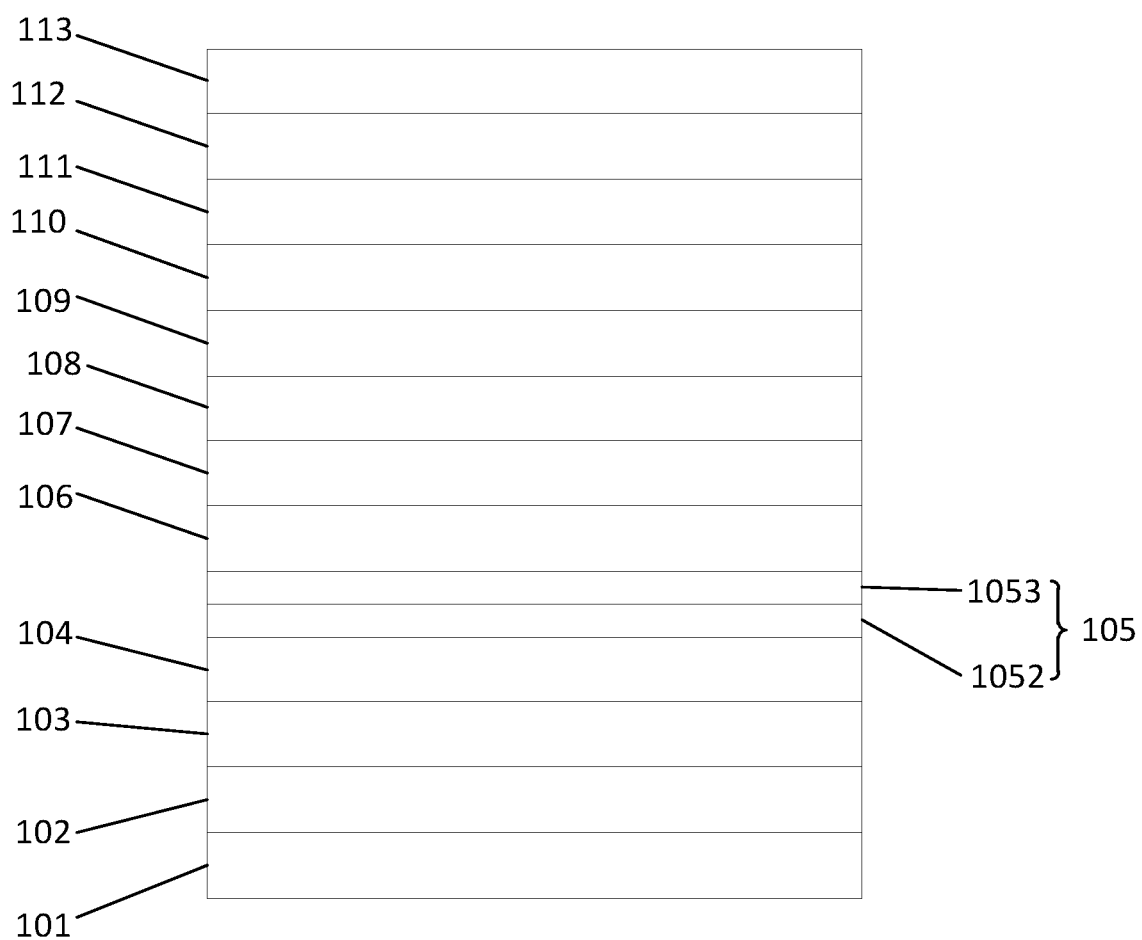
FIG. 4 is another schematic structural view showing the electroluminescent device according to an embodiment of the present disclosure.

In a possible embodiment of the present disclosure, as shown in FIG. 4, the first secondary hole injection layer 1052 and the second secondary hole injection layer 1053 are arranged sequentially in the direction from the anode layer 104 to the hole transport layer 106. According to the above-mentioned analysis, when the resistance value R5 of the first secondary hole injection layer 1052 is less than the resistance value R6 of the second secondary hole injection layer 1053, it is able to increase the resistance value of the lateral transport path in the hole injection layer, so as to suppress the lateral transport of carriers along the hole injection layer, and reduce the probability of crosstalk occurring in the electroluminescent device.

As shown in FIG. 4, when the cross-sectional areas of the first and second secondary hole injection layers 1052 and 1053 and relative positions with respect to the anode layer 104 are maintained, the resistance values of the first and second secondary hole injection layers 1052 and 1053 are only related to their respective resistivity. The material of which each secondary hole injection layer 1051 is made includes the first hole injection material, and resistivity of the first hole injection material is less than resistivity of each of the other materials in the secondary hole injection layer 1051. Therefore, the greater the content of the first hole injection material in the secondary hole injection layer 1051, the less overall resistivity of the secondary hole injection layer 1051.

As shown in FIG. 4, when the content of the first hole injection material in the first secondary hole injection layer 1052 is greater than the content of the first hole injection material in the second secondary hole injection layer 1053, the resistance value of the first secondary hole injection layer 1052 is less than the resistance value of the second secondary hole injection layer 1053. Furthermore, since a HOMO energy level of the first hole injection material is larger than HOMO energy levels of other materials in the secondary hole injection layer 1051, a HOMO energy level of the first secondary hole injection layer 1052 is larger than a HOMO energy level of the second secondary hole injection layer 1053. It is equivalent that the HOMO energy level of the first secondary hole injection layer 1052 and the HOMO energy level of the second secondary hole injection layer 1053 are inserted between a HOMO energy level of the anode layer 104 and a HOMO energy level of the hole transport layer 106, so that a HOMO energy level difference between HOMO energy levels of any two adjacent layers is less than a HOMO energy level difference between the HOMO energy levels of the anode layer 104 and the hole transport layer 106. Thus, it is able to reduce the potential barrier between the anode layer 104 and the hole transport layer 106, thereby ensuring the injection efficiency of carriers from the anode layer 104 into the secondary hole injection layer 1051 adjacent to the anode layer 104.

As can be appreciated by those skilled in the art, it is able to adjust the HOMO energy level of each secondary hole injection layer 1051 through controlling the content of the first hole injection material in each secondary hole injection layer 1051, so as to enable the HOMO energy levels of the secondary hole injection layers 1051 to increase in a step-like manner in the direction from the anode layer 104 to the hole transport layer 106. In a possible embodiment of the present disclosure, the HOMO energy levels of at least two secondary hole injection layers 1051 increase gradually in the direction from the anode layer 104 to the hole transport layer 106. Therefore, it is able to reduce the potential barrier between the anode layer 104 and the hole transport layer 106, so as to ensure that, after the carriers enter the secondary hole injection layer 1051 adjacent to the anode layer 104 from the anode layer 104, the carriers may pass through the secondary hole injection layers 1051 successively and be transported to the hole transport layer 106, thereby ensuring the carrier injection efficiency.

In an embodiment of the present disclosure, the material of which each secondary hole injection layer 1051 is made includes the first hole injection material and a second hole injection material, resistivity of the first hole injection material is less than resistivity of the second hole injection material, and the second hole injection material is the same as a material of which the hole transport layer is made.

In a possible embodiment of the present disclosure, when the resistivity of the first hole injection material is less than the resistivity of the second hole injection material, the resistivity of the first secondary hole injection layer 1052 is less than the resistivity of the second secondary hole injection layer 1053 through adjusting a content ratio of the first hole injection material to the second hole injection material in each secondary hole injection layer 1051, and thereby the resistance value of the first secondary hole injection layer 1052 is less than the resistance value of the second secondary hole injection layer 1053. In the embodiments of the present disclosure, the second hole injection material is the same as the material of which the hole transport layer 106 is made, it is able to reduce the manufacturing cost of the electroluminescent device.

In a possible embodiment of the present disclosure, a HOMO energy level of the first hole injection material is larger than a HOMO energy level of the second hole injection material, it is able to ensure that the HOMO energy levels of the first hole injection layer 105 and the hole transport layer 106 match, so as to reduce the potential barrier between the anode layer 104 and the hole transport layer 106, thereby ensuring the injection efficiency of the carriers.

In a possible embodiment of the present disclosure, the second secondary hole injection layer 1053 is located at one side of the first secondary hole injection layer 1052 away from the anode layer 104, the content of the first hole injection material in the first secondary hole injection layer 1052 is in a range of 2% to 50%, and a content of the first hole injection material in the second secondary hole injection layer 1053 is in a range of 0.5% to 2%. It should be appreciated that the content range of the first hole injection material in the first secondary hole injection layer 1052 includes an end value of 50%, and the content range of the first hole injection material in the second secondary hole injection layer 1053 includes an end value of 0.5%. In the case that the content of the first hole injection material in the first secondary hole injection layer 1052 is at the end value of 2%, the content of the first hole injection material in the second secondary hole injection layer 1053 is not at the end value of 2%, so as to ensure that the resistivity of the first secondary hole injection layer 1052 and the second secondary hole injection layer 1053 are different, and vice versa.

In a possible embodiment of the present disclosure, the first hole injection material includes: at least one of a series of P-type doped material of Novaled GmbH (such as NDP-2, NDP-9), 2,3,5,6-tetrafluoro-7,7',8,8'-tetracyanoquinodimethane (F4-TCNQ), tris(4-bromophenyl)ammoniumyl hexachloroantimonate (TBAHA) or copper phthalocyanine (CuPc). The second hole injection material includes at least one of N4,N4'-Di(naphthalen-1-yl)-N4,N4'-diphenyl-[1,1'-biphenyl]-4,4'-diamine (NPB), triphenyldiamine derivatives (TPD), N,N'-Diphenyl-N,N'-bis(4'-(N,N-bis(naphth-1-yl)-amino)-biphenyl-4-yl)-benzidine (TPTE) or 1,3,5-Tris[(3-methylphenyl)phenylamino]benzene (TDAB).

In an embodiment of the present disclosure, the first secondary hole injection layer 1052 has a thickness in a range of 1 nm to 5 nm, including the end values of 1 nm and 5 nm, and the second secondary hole injection layer 1053 has a thickness in a range of 2 nm to 10 nm, including the end values of 2 nm and 10 nm.

According to the formula 2 and the above-mentioned analysis, it is able to control the resistance values of the first secondary hole injection layer 1052 and the second secondary hole injection layer 1053 through controlling the cross-sectional areas of the first secondary hole injection layer 1052 and the second secondary hole injection layer 1053, thereby controlling the resistance value of the first hole injection layer.

In an embodiment of the present disclosure, as shown in FIG. 4, the electroluminescent device further includes a light emitting layer 108 and an electron blocking layer 107. The electron blocking layer 107 is located at one side of the hole transport layer 106 away from the anode layer 104, and the light emitting layer 108 is located at one side of the electron blocking layer 107 away from the anode layer 104. A HOMO energy level of the electron blocking layer 107 is located between the HOMO energy level of the hole transport layer 106 and a HOMO energy level of the light emitting layer 108, so as to reduce the potential barrier between the anode layer 104 and the hole transport layer 106, thereby to ensure the injection of the carriers. Furthermore, when the LUMO energy level of the electron blocking layer 107 is higher than the LUMO energy level of the hole transport layer 106, it is able to block the transport of electrons and prevent the electrons from entering the hole transport layer 106 from the light emitting layer 108, or even entering the first hole injection layer.

In an embodiment of the present disclosure, as shown in FIG. 4, the electroluminescent device further includes a base substrate 101, a driving circuit layer 102, a reflective layer 103, a hole blocking layer 109, an electron transport layer 110, an electron injection layer 111, a cathode layer 112 and a light extracting layer 113.

Based on a same inventive concept, a method for manufacturing an electroluminescent device is further provided in the embodiments of the present disclosure, including: forming a first hole injection layer including at least two secondary hole injection layers on a side of the anode layer, and forming a hole transport layer on a side of the first hole injection layer away from the anode layer. An equivalent resistance value of the at least two secondary hole injection layers is greater than a first threshold value, where the first threshold value is a resistance value of a second hole injection layer in a case that one second hole injection layer is arranged between the anode layer and the hole transport layer. A thickness of the second hole injection layer is equal to a thickness of the first hole injection layer, and resistivity of each secondary hole injection layer is not less than resistivity of the second hole injection layer.

In some embodiments, the method may include forming the driving circuit layer 102, the reflective layer 103 and the anode layer 104 sequentially on one side of the base plate 101.

The first hole injection layer 105 including at least two secondary hole injection layers 1051 is formed on one side of the anode layer 104, and the hole transport layer 106 is formed on the side of the first hole injection layer 105 away from the anode layer 104.

In a possible embodiment of the present disclosure, the first secondary hole injection layer 1052 and the second secondary hole injection layer 1053 are sequentially formed on one side of the anode layer 104 by using a vacuum evaporation process. The materials of which the first secondary hole injection layer 1052 and the second secondary hole injection layer 1053 are made each includes the second hole injection material doped with the first hole injection material. When the first secondary hole injection layer 1052 and the second secondary hole injection layer 1053 are formed through evaporation by using the second hole injection material doped with the first hole injection material, it is able to effectively prevent crystallization from occurring when the first hole injection material is evaporated alone.

The hole transport layer 106 is formed through evaporation of the second hole injection material by using a vacuum evaporation process.

The electron blocking layer 107 is formed on one side of the hole transport layer 106 by using a vacuum evaporation process. The HOMO energy level of the electron blocking layer 107 is between the HOMO energy level of the hole transport layer 106 and the HOMO energy level of the light emitting layer 108, and a LUMO energy level of the electron blocking layer 107 is higher than a LUMO energy level of the hole transport layer 106. In a possible embodiment of the present disclosure, a material of which the electron blocking layer 107 is made includes at least one of 2-(4-tert-butylphenyl)-5-(4-biphenyl) 1,3,4-oxadiazole or 3 (biphenyl)-4-yl-5-(4-tert-butylphenyl)-4H-1,2,4-triazole. In embodiments of the present disclosure, the electron blocking layer 107 has a thickness in a range of 5 nm to 10 nm, including the end values of 5 nm and 10 nm.

A first secondary light emitting layer 1081 and a second secondary light emitting layer 1082 are formed on one side of the electron blocking layer 107 by using a vacuum evaporation process.

The hole blocking layer 109, the electron transport layer 110, the electron injection layer 111 and the cathode layer 112 are sequentially formed on one side of the second secondary light emitting layer 1082 by using a vacuum evaporation process.

In a possible embodiment of the present disclosure, a material of which the hole blocking layer 109 is made may include 1,3,5-tris(1-phenyl-1H-benzimidazol-2-yl)benzene. the hole blocking layer 109 may have a thickness in a range of 1 nm to 10 nm, including the end values of 1 nm and 10 nm. A material of which the electron transport layer 110 is made includes at least one of 2-(4-biphenyl)-5-phenyl-oxadiazole (PBD), 2,5-di(1-naphthyl)-1,3,5-oxadiazole (BND) or 2,4,6-triphenoxy-1,3,5-triazine (TRZ). The electron transport layer 110 has a thickness in a range of 10 nm to 40 nm, including the end values of 10 nm and 40 nm. A material of which the electron injection layer 111 is made includes at least one of alkali metal fluorides MF, $li_2O$ and $LiBO_2$, where the alkali metal M in MF may be Li (lithium), Na (sodium), K (potassium), Rb (rubidium) or Cs (cesium). The electron transport layer 110 has a thickness in a range of 5 nm to 10 nm, including the end values of 5 nm and 10 nm. A material of which the cathode layer 112 is made includes such a metal material as Mg (magnesium), Ag (silver), Al (aluminium), Li (lithium), K (potassium) or Ca (calcium), or alloys of Mg, Ag, Al, Li, K and Ca. The cathode layer 112 has a thickness in a range of 10 nm to 20 nm, including the end values of 10 nm and 20 nm.

The light extracting layer 113 is formed on one side of the cathode layer 112 by using a vacuum evaporation process or an inkjet printing process.

Based on the same inventive concept, a display panel is further provided in the embodiments of the present disclosure, including the above-mentioned electroluminescent device.

In this embodiment, since the display panel is realized by using any one of the electroluminescent devices in the foregoing embodiments, the principles and technical effects thereof may refer to the foregoing embodiments and will not be described in detail herein.

Based on the same inventive concept, a display device is further provided in the embodiments of the present disclosure, including the above-mentioned electroluminescent device or the above-mentioned display panel.

In the embodiment, since the display device includes any one of the electroluminescent devices in the above-mentioned embodiments or the display panel in the above-mentioned embodiments, the principles and technical effects thereof may refer to the above-mentioned embodiments and will not be described in detail herein.

In the embodiments of the present disclosure, at least the following beneficial effects may be achieved.

In the electroluminescent device, when there are multiple secondary hole injection layers 1051, there are multiple secondary hole injection layers 1051 with different resistance values in the first hole injection layer 105, an overall resistance value (or equivalent resistance value) of the first hole injection layer 105 is less than a resistance value of any one of the secondary hole injection layers 1051, and the overall resistance value of the first hole injection layer 105 of the present disclosure is greater than a resistance value of a hole injection layer (namely, the second hole injection layer) provided in a single layer. Thus, it is able to increase a resistance value of a lateral transport path of a hole injection layer between an anode layer and a hole-transport layer as a whole, suppress the lateral transport of the carriers along the hole injection layer, and reduce the probability of crosstalk occurring in the electroluminescent device, thereby to ensure the operational stability of the electroluminescent device. The carriers include holes.

It should be appreciated that, steps, measures and schemes in various operations, methods and processes that have already been discussed in the embodiments of the present disclosure may be replaced, modified, combined or deleted. In a possible embodiment of the present disclosure, the other steps, measures and schemes in various operations, methods and processes that have already been discussed in the embodiments of the present disclosure may also be replaced, modified, rearranged, decomposed, combined or deleted. In another possible embodiment of the present disclosure, steps, measures and schemes in various operations, methods and processes that are known in the related art and have already been discussed in the embodiments of the present disclosure may also be replaced, modified, rearranged, decomposed, combined or deleted.

In addition, such words as "first" and "second" may merely be adopted to differentiate different features rather than to implicitly or explicitly indicate any number or importance, i.e., they may be adopted to implicitly or explicitly indicate that there is at least one said feature. Further, such a phrase as "a plurality of" may be adopted to indicate that there are two or more features, unless otherwise specified.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An electroluminescent device comprising: an anode layer, a first hole injection layer and a hole transport layer, wherein the first hole injection layer is located between the anode layer and the hole transport layer;
the first hole injection layer comprises at least two secondary hole injection layers, an equivalent resistance value of the at least two secondary hole injection layers is greater than a first threshold value, wherein the first threshold value is a resistance value of a second hole injection layer in a case that the second hole injection layer is arranged between the anode layer and the hole transport layer;
wherein a thickness of the second hole injection layer is equal to a thickness of the first hole injection layer, and resistivity of each of the at least two secondary hole injection layers is not less than resistivity of the second hole injection layer.

2. The electroluminescent device according to claim 1, wherein a resistance value of a secondary hole injection layer adjacent to the anode layer is less than a resistance value of a secondary hole injection layer adjacent to the hole transport layer.

3. The electroluminescent device according to claim 1, wherein resistance values of the at least two secondary hole injection layers increase in a step-like manner in a direction from the anode layer to the hole transport layer.

4. The electroluminescent device according to claim 3, wherein the resistance values of the at least two secondary hole injection layers increase gradually in the direction from the anode layer to the hole transport layer.

5. The electroluminescent device according to claim 1, wherein resistivity of a secondary hole injection layer adjacent to the anode layer is less than resistivity of a secondary hole injection layer adjacent to the hole transport layer.

6. The electroluminescent device according to claim 5, wherein a material of which each of the at least two secondary hole injection layers is made comprises a first hole injection material, and contents of the first hole injection material in the at least two secondary hole injection layers decrease in a direction from the anode layer to the hole transport layer.

7. The electroluminescent device according to claim 6, wherein the material of which each of the at least two secondary hole injection layers is made comprises the first hole injection material and a second hole injection material, resistivity of the first hole injection material is less than resistivity of the second hole injection material, and the second hole injection material is the same as a material of which the hole transport layer is made.

8. The electroluminescent device according to claim 6, wherein the first hole injection layer comprises a first secondary hole injection layer and a second secondary hole injection layer, the second secondary hole injection layer is located at one side of the first secondary hole injection layer away from the anode layer;
a content of the first hole injection material in the first secondary hole injection layer ranges from 2% to 50%, and a content of the first hole injection material in the second secondary hole injection layer ranges from 0.5% to 2%.

9. The electroluminescent device according to claim 8, wherein the first secondary hole injection layer has a thickness of 1 nm to 5 nm and the second secondary hole injection layer has a thickness of 2 nm to 10 nm.

10. A method for manufacturing an electroluminescent device, comprising:
forming a first hole injection layer comprising at least two secondary hole injection layers on one side of the anode layer, and forming a hole transport layer on one side of the first hole injection layer away from an anode layer, wherein an equivalent resistance value of the at least two secondary hole injection layers is greater than a first threshold value, wherein the first threshold value is a resistance value of a second hole injection layer in a case that the second hole injection layer is arranged between the anode layer and the hole transport layer;
wherein a thickness of the second hole injection layer is equal to a thickness of the first hole injection layer, and resistivity of each of the at least two secondary hole injection layers is not less than resistivity of the second hole injection layer.

11. The method according to claim 10, wherein a resistance value of a secondary hole injection layer adjacent to the anode layer is less than a resistance value of a secondary hole injection layer adjacent to the hole transport layer.

12. The method according to claim 10, wherein resistance values of the at least two secondary hole injection layers increase in a step-like manner in a direction from the anode layer to the hole transport layer.

13. The method according to claim 12, wherein the resistance values of the at least two secondary hole injection layers increase gradually in the direction from the anode layer to the hole transport layer.

14. The method according to claim 10, wherein resistivity of a secondary hole injection layer adjacent to the anode layer is less than resistivity of a secondary hole injection layer adjacent to the hole transport layer.

15. The method according to claim 14, wherein a material of which each of the at least two secondary hole injection layers is made comprises a first hole injection material, and contents of the first hole injection material in the at least two secondary hole injection layers decrease in a direction from the anode layer to the hole transport layer.

16. The method according to claim 15, wherein the material of which each of the at least two secondary hole injection layers is made comprises the first hole injection material and a second hole injection material, resistivity of the first hole injection material is less than resistivity of the second hole injection material, and the second hole injection material is the same as a material of which the hole transport layer is made.

17. The method according to claim 15, wherein the first hole injection layer comprises a first secondary hole injection layer and a second secondary hole injection layer, the second secondary hole injection layer is located at one side of the first secondary hole injection layer away from the anode layer;
a content of the first hole injection material in the first secondary hole injection layer ranges from 2% to 50%, and a content of the first hole injection material in the second secondary hole injection layer ranges from 0.5% to 2%.

18. The method according to claim 17, wherein the first secondary hole injection layer has a thickness of 1 nm to 5 nm and the second secondary hole injection layer has a thickness of 2 nm to 10 nm.

19. A display panel comprising the electroluminescent device according to claim 1.

20. A display device comprising the display panel according to claim 19.

* * * * *